United States Patent
Chen et al.

(10) Patent No.: US 12,490,831 B2
(45) Date of Patent: Dec. 9, 2025

(54) SLIDE RAIL ASSEMBLY

(71) Applicants: King Slide Works Co., Ltd., Kaohsiung (TW); King Slide Technology Co., Ltd., Kaohsiung (TW)

(72) Inventors: Ken-Ching Chen, Kaohsiung (TW); Shun-Ho Yang, Kaohsiung (TW); Kai-Wen Yu, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 72 days.

(21) Appl. No.: 18/588,543

(22) Filed: Feb. 27, 2024

(65) Prior Publication Data

US 2025/0120506 A1 Apr. 17, 2025

(30) Foreign Application Priority Data

Oct. 12, 2023 (TW) .................................. 112139307

(51) Int. Cl.
*A47B 88/477* (2017.01)
*E05B 65/46* (2017.01)

(52) U.S. Cl.
CPC ............ *A47B 88/477* (2017.01); *E05B 65/46* (2013.01)

(58) Field of Classification Search
CPC .......... A47B 88/477; A47B 2088/4235; A47B 88/50; E05B 65/46; H05K 7/1489
See application file for complete search history.

(56) References Cited

U.S. PATENT DOCUMENTS

| | | | | |
|---|---|---|---|---|
| 1,455,297 A | * | 5/1923 | Lyons | B26B 17/02 30/271 |
| 5,570,510 A | * | 11/1996 | Linden | B26B 13/28 30/192 |
| 5,689,888 A | * | 11/1997 | Linden | B26B 13/26 30/192 |
| 6,789,324 B2 | * | 9/2004 | Linden | B26B 13/26 30/341 |
| 6,883,884 B2 | * | 4/2005 | Chen | A47B 88/423 312/334.44 |
| 7,604,308 B2 | * | 10/2009 | Tseng | A47B 88/423 312/334.46 |

(Continued)

FOREIGN PATENT DOCUMENTS

| | | | | |
|---|---|---|---|---|
| CN | 102783830 A | * | 11/2012 | |
| CN | 204181228 U | * | 3/2015 | E05C 3/165 |

(Continued)

*Primary Examiner* — Hanh V Tran
(74) *Attorney, Agent, or Firm* — Best & Flanagan LLP

(57) ABSTRACT

A slide rail assembly includes a first rail, a second rail, a blocking feature, two operating members and a locking member. The blocking feature is arranged on the first rail. The two operating members and the locking member are movably mounted on the second rail. When the second rail is located at a predetermined position relative to the first rail, the locking member is blocked by the blocking feature to prevent the second rail from being moved away from the predetermined position. When one of the two operating members is operated, the locking member is configured to be driven to move to allow the second rail to be moved away from the predetermined position.

11 Claims, 11 Drawing Sheets

(56) References Cited

U.S. PATENT DOCUMENTS

| | | | |
|---|---|---|---|
| 7,798,581 B2 * | 9/2010 | Chen | G06F 1/183 |
| | | | 312/334.4 |
| 8,317,278 B2 * | 11/2012 | Enos | A47B 88/493 |
| | | | 312/334.47 |
| 9,609,778 B1 * | 3/2017 | Spencer | G06F 1/183 |
| 9,723,745 B2 * | 8/2017 | Qi | G06F 1/18 |
| 9,867,462 B2 * | 1/2018 | Chen | A47B 88/427 |
| 10,349,742 B2 * | 7/2019 | Chen | H02B 1/36 |
| 10,798,844 B2 * | 10/2020 | Lee | H05K 5/0221 |
| 10,827,641 B1 * | 11/2020 | Shen | H05K 7/20709 |
| D1,015,092 S * | 2/2024 | Barrette | D8/5 |
| 12,096,589 B2 * | 9/2024 | Lin | H05K 7/1401 |
| 2008/0122333 A1 | 5/2008 | Tseng et al. | |
| 2010/0277047 A1 * | 11/2010 | Sung | E05B 65/46 |
| | | | 312/333 |
| 2011/0279973 A1 * | 11/2011 | Terwilliger | H05K 7/1489 |
| | | | 312/223.2 |

FOREIGN PATENT DOCUMENTS

| | | | | |
|---|---|---|---|---|
| DE | 29822421 U1 * | 3/1999 | | A01G 3/0251 |
| DE | 102005007001 A1 * | 8/2006 | | A47B 88/40 |
| DE | 202009011027 U1 * | 12/2009 | | A47B 96/06 |
| FI | 121534 B * | 12/2010 | | A01G 3/0475 |
| GB | 2375500 A * | 11/2002 | | B25B 7/12 |
| GB | 2483341 B * | 9/2012 | | A47B 88/57 |
| TW | I665983 B * | 7/2019 | | A47B 88/57 |
| WO | WO-2017099724 A1 * | 6/2017 | | H05K 7/1489 |

\* cited by examiner

SLIDE RAIL ASSEMBLY

BACKGROUND OF THE INVENTION

1. Field of the Invention

The present invention relates to a slide rail mechanism, and more particularly, to a slide rail assembly capable of unlocking two slide rails relative to each other at a predetermined position through operating one of two operating members.

2. Description of the Prior Art

U.S. Pat. No. 6,883,884 B2 discloses a latch assembly for a slide rail device. The slide rail device comprises a first rail and a second rail movable relative to each other. The first rail is arranged with a latch assembly, and the second rail is arranged with a latch base. When the first rail is located at a retracted position relative to the second rail, the latch assembly is engaged with the latch base, such that the first rail is held at the retracted position. When a user is going to unlock the latch assembly, the user must simultaneously press two actuating members of the latch assembly, such that hooks of two corresponding unlocking members are no longer engaged with the latch base in order to allow the first rail to be moved away from the retracted position relative to the second rail.

However, for different market requirements, it is important to develop a slide rail product capable of unlocking two slide rails relative to each other without requiring simultaneous operation of two actuating members (or operating members).

SUMMARY OF THE INVENTION

The present invention provides a slide rail assembly capable of unlocking two slide rails relative to each other at a predetermined position through operating one of two operating members.

According to an embodiment of the present invention, a slide rail assembly comprises a first rail, a second rail, two operating members and a locking member. The second rail is movable relative to the first rail. The blocking feature is arranged on the first rail. The two operating members are movably mounted on the second rail. The locking member is movably mounted on the second rail. When the second rail is located at a predetermined position relative to the first rail and when the locking member is in a locking state, the locking member and the blocking feature are configured to block each other in order to prevent the second rail from being moved away from the predetermined position. When one of the two operating members is operated, the locking member is configured to be driven to switch from the locking state to an unlocking state, such that the locking member and the blocking feature no longer block each other, in order to allow the second rail to be moved away from the predetermined position.

According to an embodiment of the present invention, a slide rail assembly comprises a first rail, a second rail, a first operating member, a second operating member and a locking member. The second rail is longitudinally movable relative to the first rail. The first operating member and the second operating member are movably mounted on the second rail, and the first operating member and the second operating member respectively comprise a first gear structure and a second gear structure. The locking member is movably mounted on the second rail. When the second rail is located at a retracted position relative to the first rail and when the locking member is in a locking state, the locking member and the first rail are configured to be locked with each other, in order to prevent the second rail from being moved away from the retracted position. During a process of one of the first operating member and the second operating member being operated to move from a first state to a second state, the other one of the first operating member and the second operating member is driven to move through the first gear structure and the second gear structure meshing with each other, so as to drive the locking member to switch from the locking state to an unlocking state in order to allow the second rail to be moved from the retracted position along a predetermined direction.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
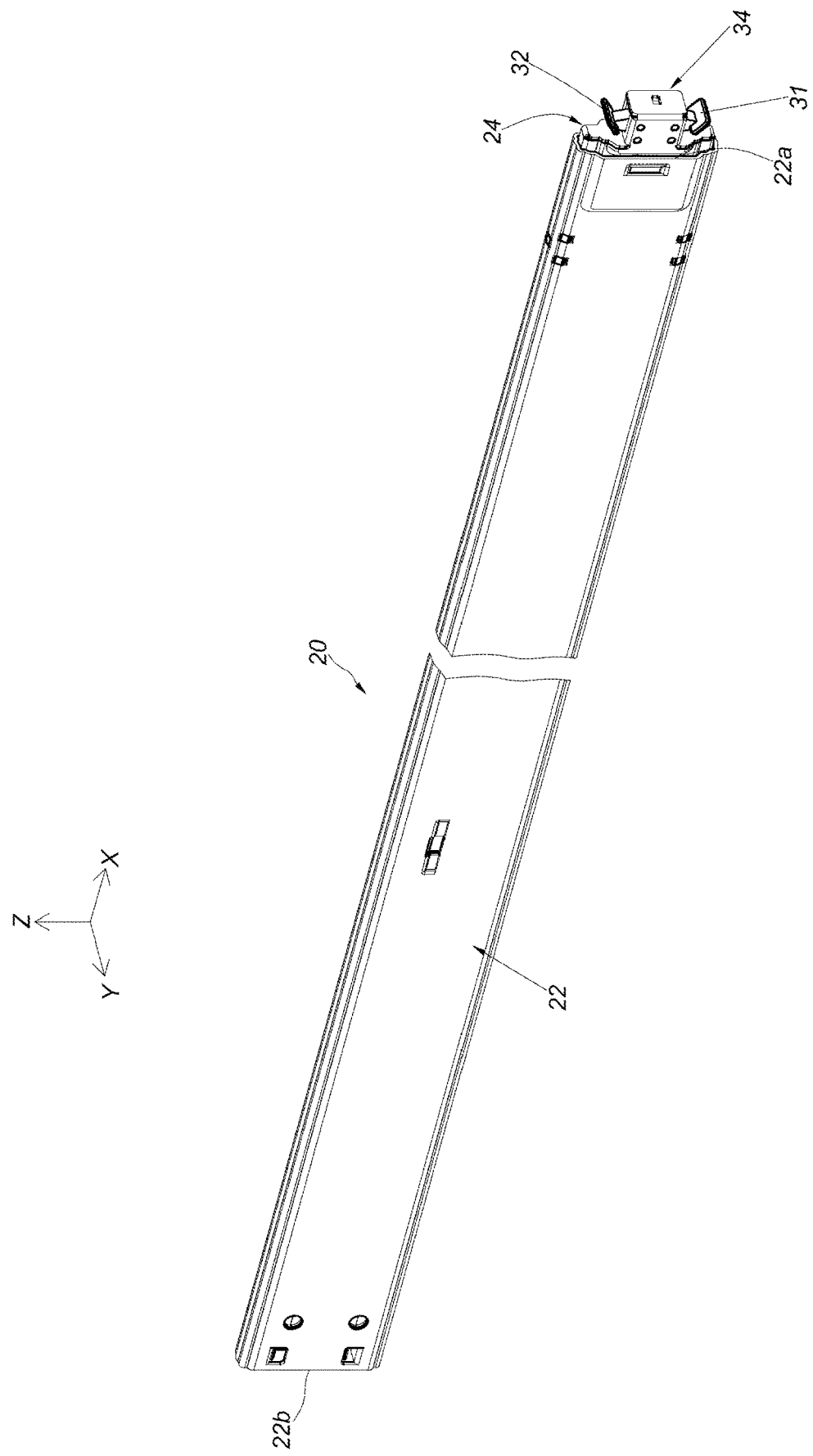
FIG. 1 is a diagram showing a slide rail assembly at least comprising a first rail and a second rail according to an embodiment of the present invention.
Figure 2:
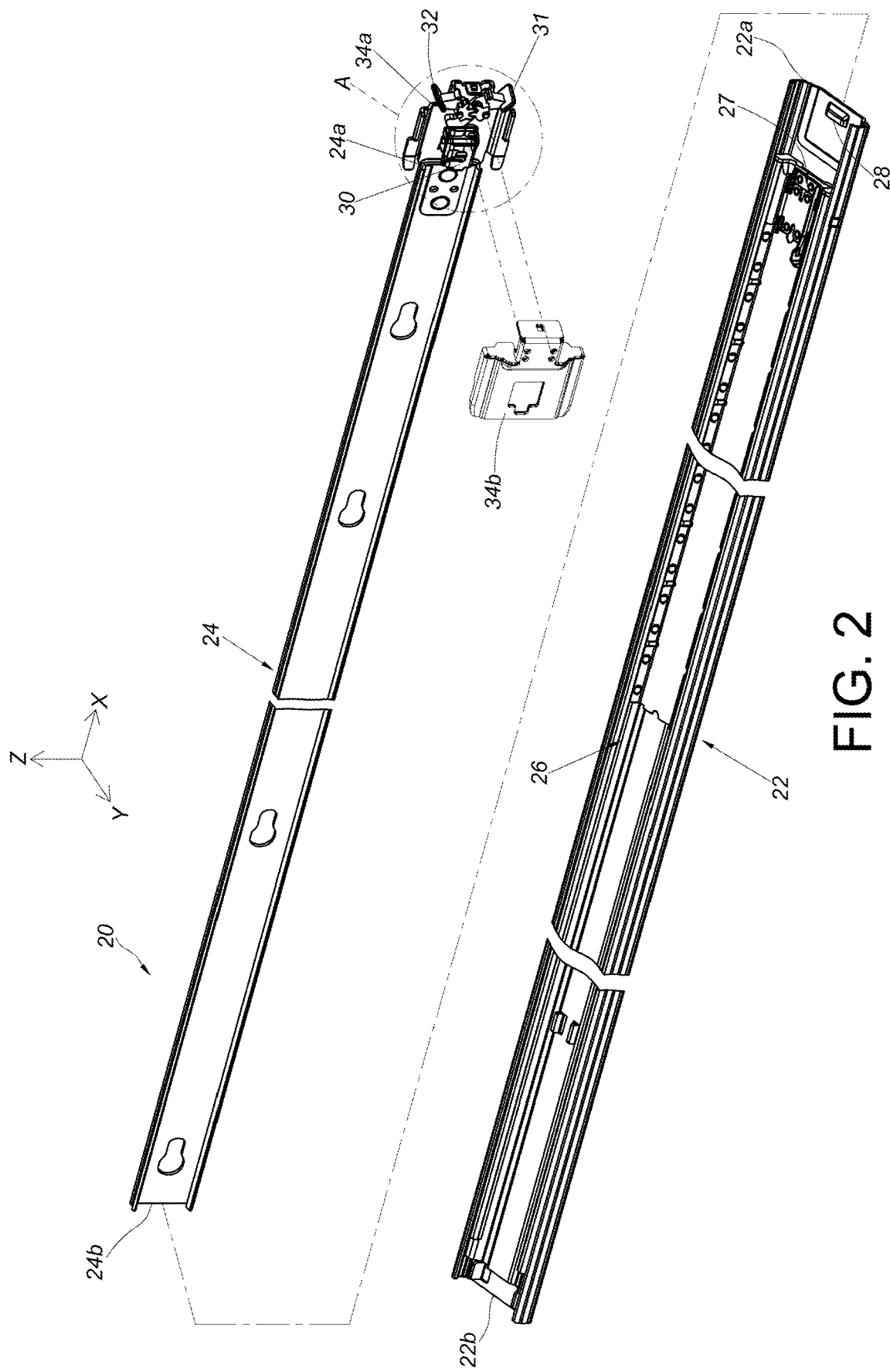
FIG. 2 is an exploded view of the first rail, the second rail and a housing of the slide rail assembly according to the embodiment of the present invention.

As shown in FIG. 1 and FIG. 2, a slide rail assembly 20 comprises a first rail 22 and a second rail 24 longitudinally movable relative to each other according to an embodiment of the present invention. Preferably, the slide rail assembly 20 further comprises a third rail 26 movably arranged between the first rail 22 and the second rail 24. The third rail 26 is formed with a passage 27 configured to movably mount the second rail 24. In addition, in the present embodiment, the X-axis is a longitudinal direction (or a length direction of the slide rail), the Y-axis is a transverse direction (or a lateral direction of the slide rail), and the Z-axis is a vertical direction (or a height direction of the slide rail).

Furthermore, the slide rail assembly 20 further comprises a blocking feature 28, a locking member 30 and two operating members (such as a first operating member 31 and a second operating member 32). The locking member 30 is configured to work with the blocking feature 28.

The blocking feature 28 is arranged on one of the first rail 22 and the second rail 24. In the present embodiment, the blocking feature 28 is arranged on the first rail 22, but the present invention is not limited thereto. The blocking feature 28 can be directly or indirectly arranged on the first rail 22. In the present embodiment, the blocking feature 28 is a protrusion; or in an alternative embodiment, the blocking feature 28 is a wall around a hole or a groove, but the present invention is not limited thereto. Preferably, the first rail 22 has a first end part 22a and a second end part 22b opposite to each other, such as a front end part and a rear end part. The blocking feature 28 is arranged on the first rail 22 and adjacent to the first end part 22a of the first rail 22.

The locking member 30, the first operating member 31 and the second operating member 32 are movably mounted on the other one of the first rail 22 and the second rail 24. In the present embodiment, the locking member 30, the first operating member 31 and the second operating member 32 are movably mounted on the second rail 24. Preferably, the second rail 24 has a first end part 24a and a second end part 24b opposite to each other, such as a front end part and a rear end part. The locking member 30, the first operating member 31 and the second operating member 32 are movably mounted on the second rail 24 and adjacent to the first end part 24a of the second rail 24.

Preferably, the second rail 24 is arranged with a housing 34 (as shown in FIG. 1). The housing 34 is connected (such as fixed) to the second rail 24 and adjacent to the first end part 24a of the second rail 24, such that the housing 34 can be seen as a part of the second rail 24. The housing 34 comprises a first housing part 34a and a second housing part 34b that can be connected to each other (as shown in FIG. 2). Preferably, the first housing part 34a and the second housing part 34b are detachably mounted to each other, and an accommodating space is defined between the first housing part 34a and the second housing part 34b. The locking member 30, the first operating member 31 and the second operating member 32 are movably arranged on the first housing part 34a on the first end part 24a of the second rail 24. Furthermore, the first housing part 34a and the second housing part 34b are configured to accommodate and/or cover most of the locking member 30, the first operating member 31 and the second operating member 32 for protection. Or, in other alternative embodiments, the locking member 30, the first operating member 31 and the second operating member 32 can be directly arranged on the second rail 24 and adjacent to the first end part 24a of the second rail 24 without being arranged on the housing 34.

Figure 3:
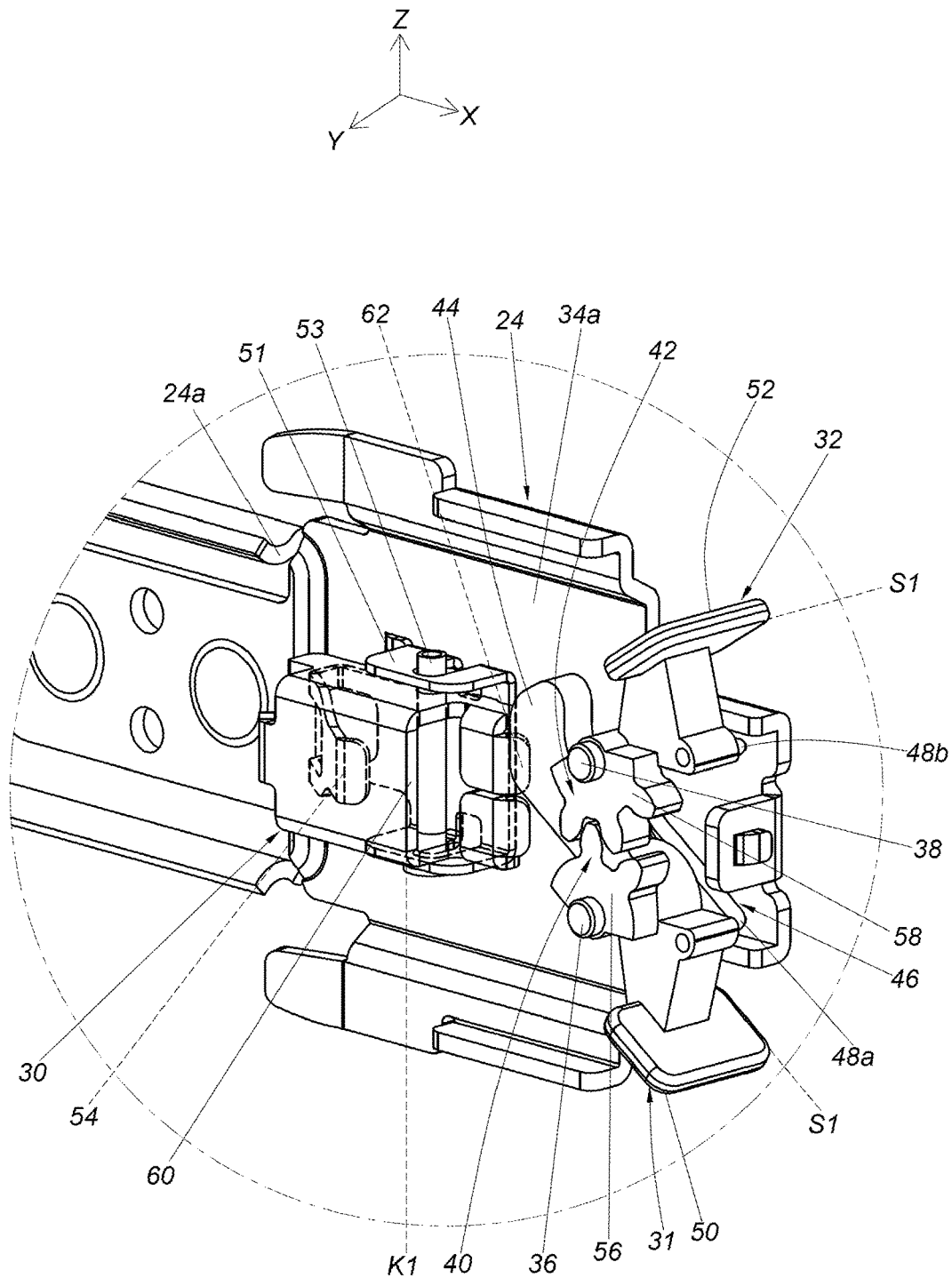
FIG. 3 is an enlarged view of an area A of FIG. 2.
Figure 4:
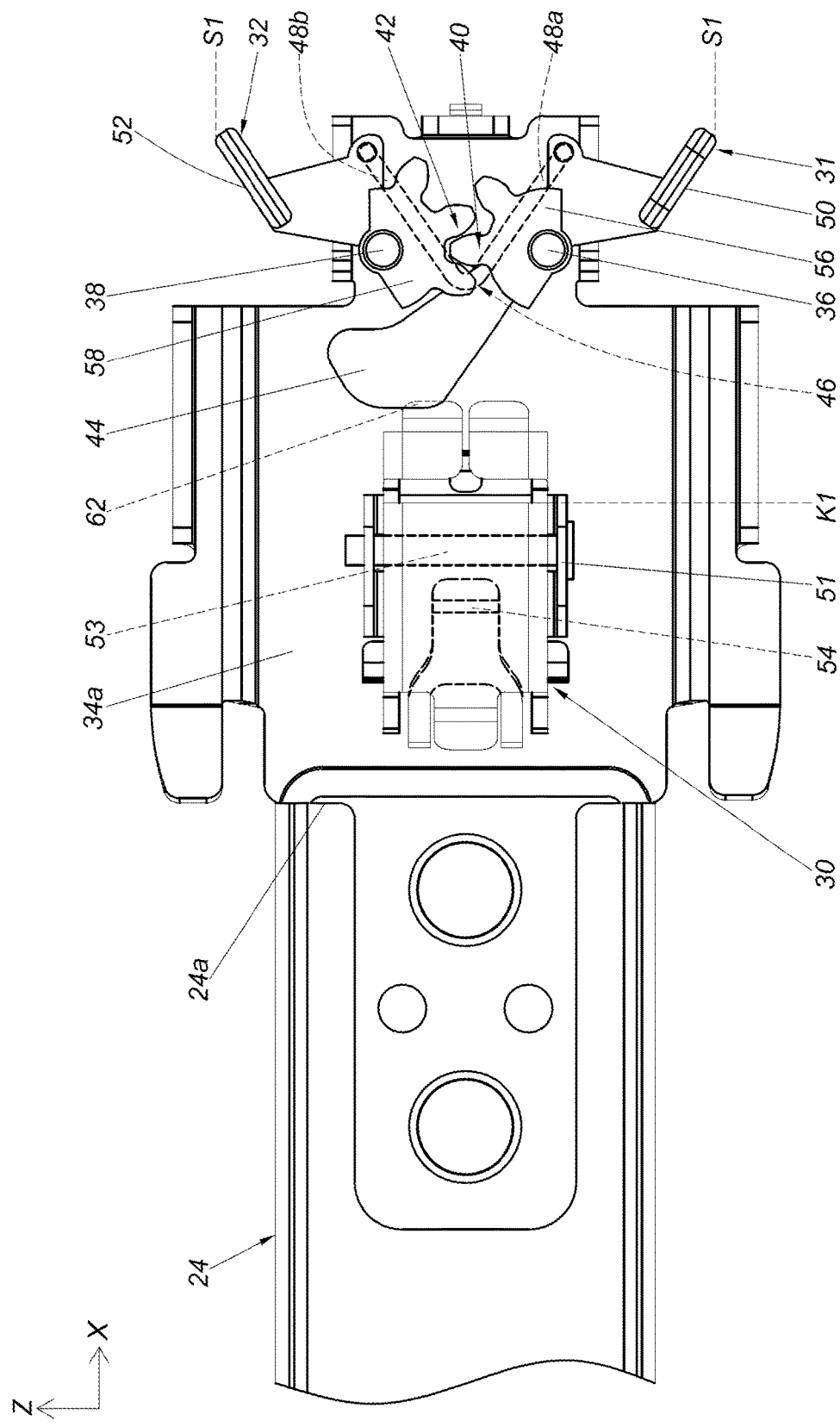
FIG. 4 is a diagram showing a portion of the second rail according to the embodiment of the present invention.

As shown in FIG. 3 and FIG. 4 (FIG. 3 and FIG. 4 only show the first housing part 34a and the second housing part 34b is omitted), the first operating member 31 and the second operating member 32 are pivotally connected to the first housing part 34a on the second rail 24 through a first shaft 36 and a second shaft 38 respectively.

Preferably, at least one of the first shaft 36 and the second shaft 38 is arranged in a direction substantially identical to the transverse direction of the second rail 24. In the present embodiment, both the first shaft 36 and the second shaft 38 are arranged in a direction substantially identical to the transverse direction of the second rail 24 (or the lateral direction of the second rail 24, or the Y-axis direction).

Preferably, the first operating member 31 and the second operating member 32 respectively have a first gear structure 40 and a second gear structure 42 configured to mesh with each other. For example, the first gear structure 40 and the second gear structure 42 have a plurality of teeth that mesh with each other.

Preferably, one of the first operating member 31 and the second operating member 32 comprises a driving part 44. In the present embodiment, the first operating member 31 comprises the driving part 44, and the driving part 44 is configured to drive the locking member 30 to move.

Preferably, the slide rail assembly 20 further comprises a return elastic member 46 configured to provide a return elastic force to at least one of the first operating member 31 and the second operating member 32. In the present embodiment, the return elastic member 46 comprises a first elastic section 48a and a second elastic section 48b configured to provide the return elastic force to the first operating member 31 and the second operating member 32 respectively. The first operating member 31 and the second operating member 32 are configured to be held in a first state S1 in response to the return elastic force of the return elastic member 46.

Preferably, the first operating member 31 and the second operating member 32 respectively comprise a first operating part 50 and a second operating part 52 configured to be operated by a user in a pressing manner. The first operating part 50 and the second operating part 52 are located at corresponding positions. Specifically, the first operating part 50 is located at a first height position (such as a lower position) on the second rail 24, and the second operating part 52 is located at a second height position (such as an upper position) on the second rail 24.

Preferably, the locking member 30 is pivotally connected to the first housing part 34a on the second rail 24 through a pivot member 53. For example, the pivot member 53 is pivotally connected to at least one lug 51 of the first housing part 34a. The pivot member 53 is arranged in a direction substantially identical to the height direction of the second rail 24 (such as the Z-axis direction). The slide rail assembly 20 further comprises an auxiliary elastic member 54. The auxiliary elastic member 54 can be an elastic piece or a component with elasticity configured to provide an auxiliary elastic force, but the present invention is not limited thereto. The locking member 30 is configured to be held in a locking state K1 in response to the auxiliary elastic force of the auxiliary elastic member 54.

Preferably, the first shaft 36 is located between the first operating part 50 and the driving part 44.

Preferably, the first operating member 31 further comprises a first working part 56 located adjacent to the first shaft 36, and the first working part 56 is arranged with the first gear structure 40. On the other hand, the second operating member 32 further comprises a second working part 58 located adjacent to the second shaft 38, and the second working part 58 is arranged with the second gear structure 42 configured to mesh with the first gear structure 40.

Figure 5:
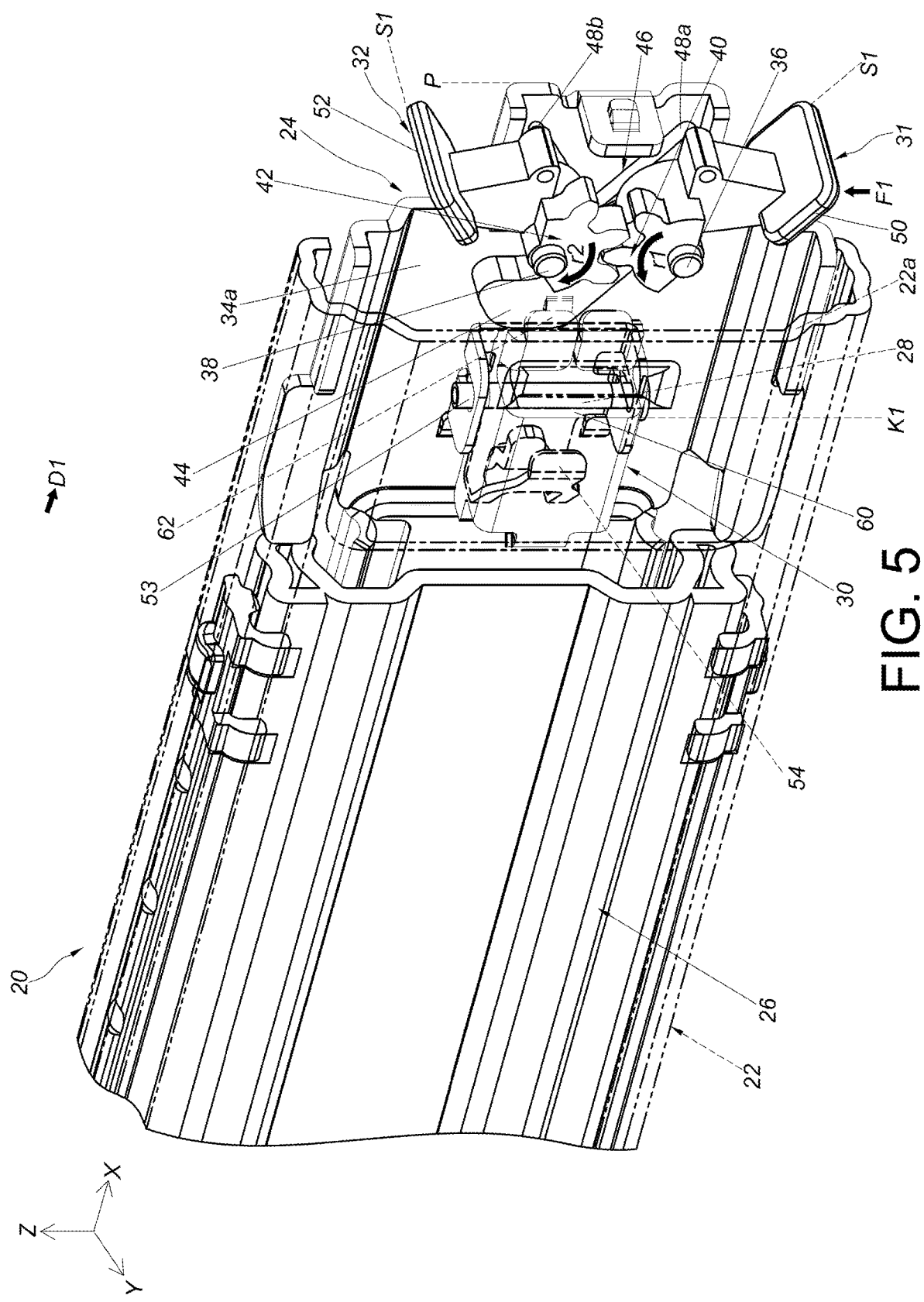
FIG. 5 is a diagram showing the second rail being locked at a predetermined position relative to the first rail from a viewing angle according to the embodiment of the present invention.
Figure 6:
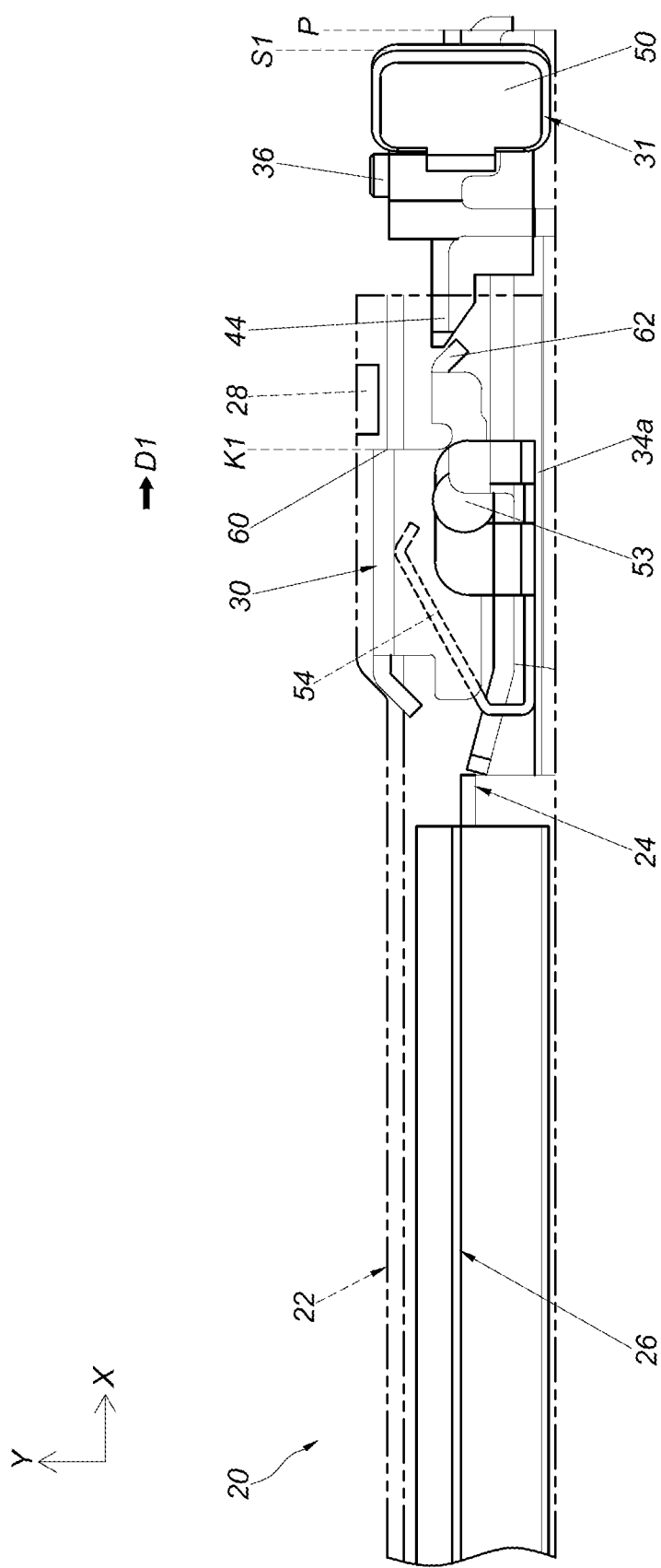
FIG. 6 is a diagram showing the second rail being locked at the predetermined position relative to the first rail from another viewing angle according to the embodiment of the present invention.

As shown in FIG. 5 and FIG. 6, when the second rail 24 is located at a predetermined position P (such as a retracted position) relative to the first rail 22 and when the locking member 30 is in the locking state K1, a locking part 60 of the locking member 30 and the blocking feature 28 are configured to block each other in order to prevent the second rail 24 from being moved away from the predetermined position P along a predetermined direction D1 (such as an opening direction). More particularly, when the locking member 30 is in the locking state K1, the blocking feature 28 is located on a moving path of the locking part 60 along the longitudinal direction, such that the locking part 60 and the blocking feature 28 are configured to block each other.

Preferably, one of the locking member 30 and the first operating member 31 is arranged with a guiding feature 62, such as an inclined surface or an arc surface, but the present invention is not limited thereto. In the present embodiment, the locking member 30 is arranged with at least one guiding feature 62, and the guiding feature 62 is configured to work with the driving part 44 of the first operating member 31.

Figure 7:
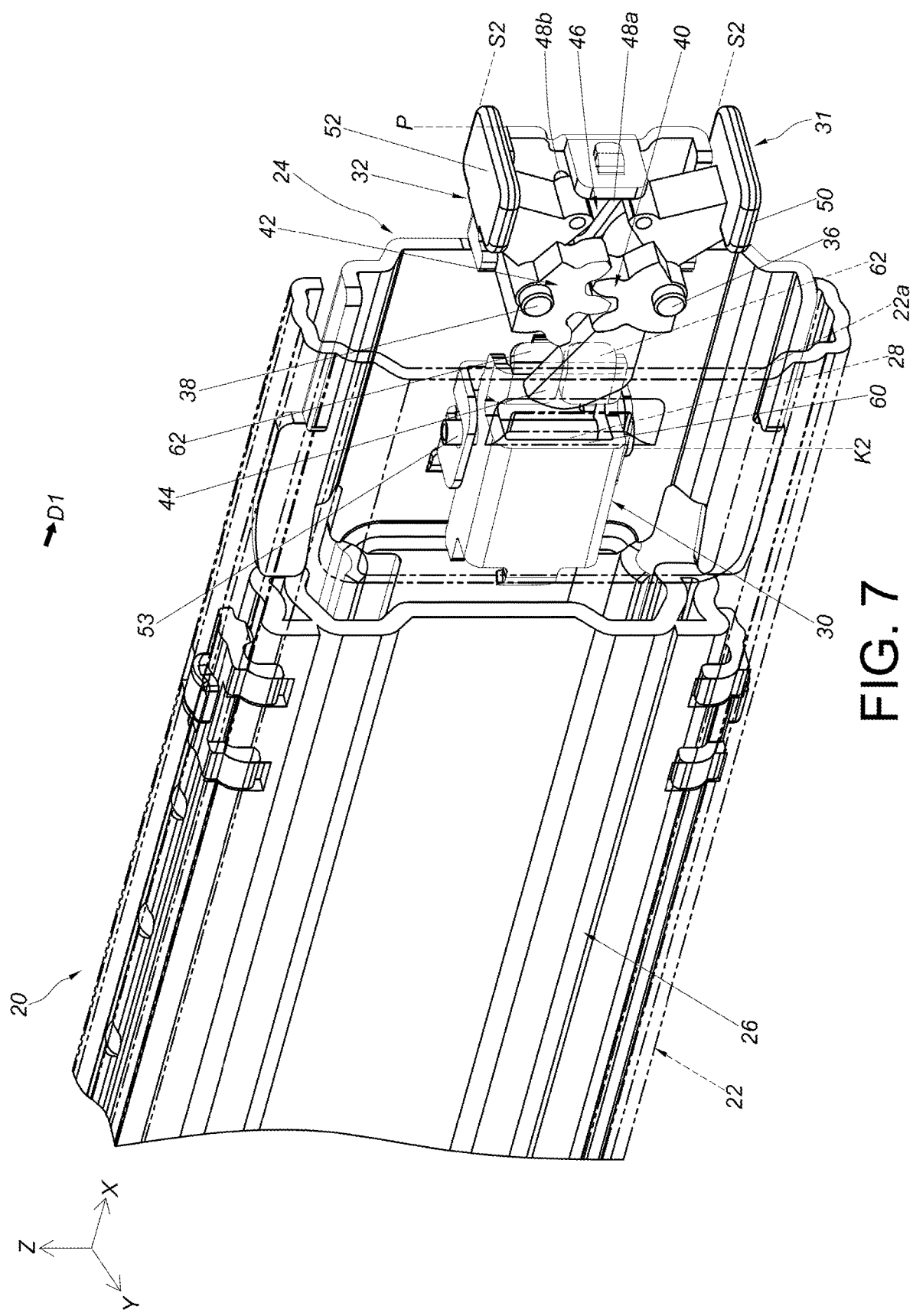
FIG. 7 is a diagram showing a user operating one of a first operating member and a second operating member to unlock the second rail relative to the first rail from a viewing angle according to the embodiment of the present invention.
Figure 8:
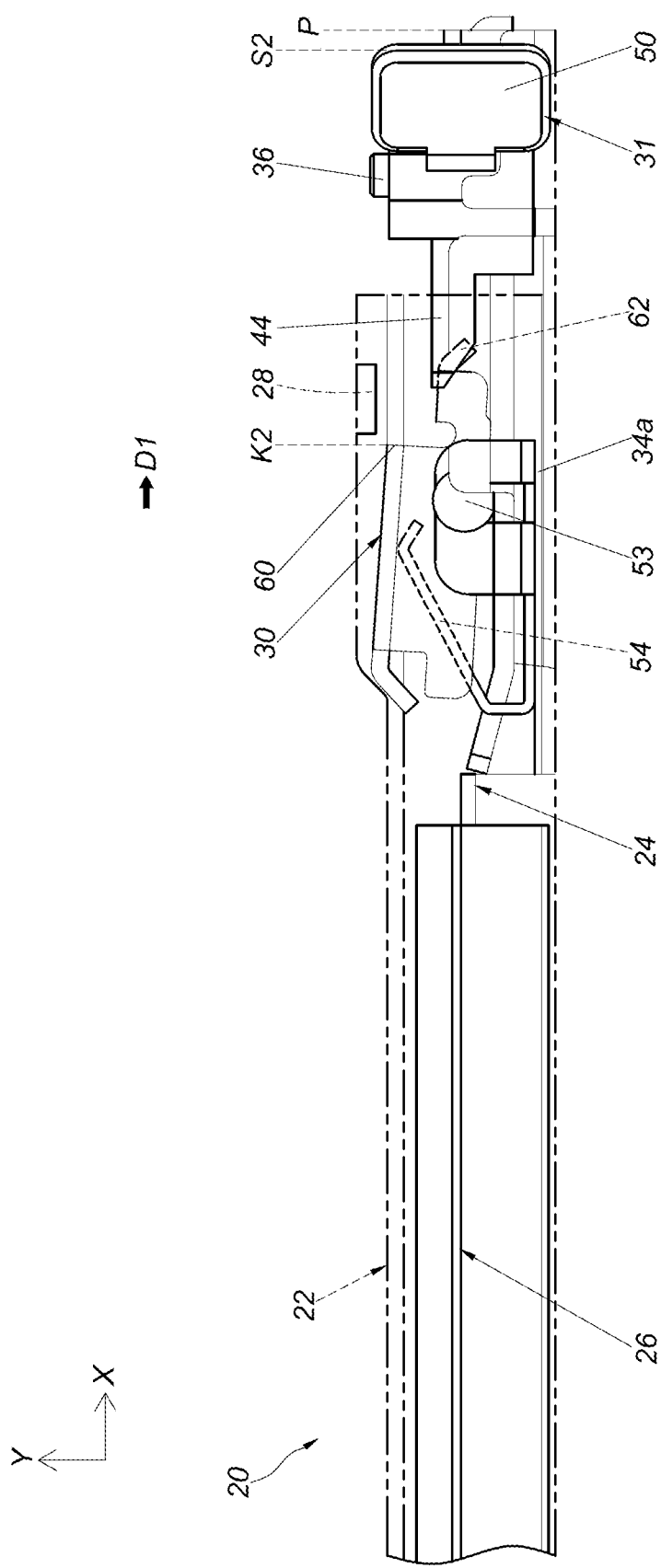
FIG. 8 is a diagram showing the user operating one of the first operating member and the second operating member to unlock the second rail relative to the first rail from another viewing angle according to the embodiment of the present invention.

As shown in FIG. 5, FIG. 7 and FIG. 8, when one of the first operating member 31 and the second operating member 32 is operated (for example, the first operating member 31 is operated), the locking member 30 is configured to be driven to switch from the locking state K1 (as shown in FIG. 5) to an unlocking state K2 (as shown in FIG. 7 and FIG. 8) in order to allow the second rail 24 to be moved away from the predetermined position P. For example, the second rail 24 is able to be moved away from the predetermined position P along the predetermined direction D1.

Furthermore, the user can apply a first force F1 to one of the first operating member 31 (the first operating part 50 of the first operating member 31) and the second operating member 32 (the second operating part 52 of the second operating member 32). As shown in FIG. 5, the user applies the first force F1 to the first operating member 31 (the first operating part 50 of the first operating member 31) to drive the first operating member 31 to switch from the first state S1 to a second state S2. During such process, the driving part 44 of the first operating member 31 is configured to contact the guiding feature 62 of the locking member 30 to easily drive the locking member 30 to switch from the locking state K1 (as shown in FIG. 5) to the unlocking state K2 (as shown in FIG. 7 and FIG. 8), in order to allow the second rail 24 to be moved from the predetermined position P along the predetermined direction D1. When the locking member 30 is in the unlocking state K2, the blocking feature 28 is no longer located on the moving path of the locking part 60 along the longitudinal direction (for example, the locking part 60 and the blocking feature 28 are not aligned with each other along the longitudinal direction), such that the locking part 60 and the blocking feature 28 no longer block each other (as shown in FIG. 8), in order to allow the second rail 24 to be moved from the predetermined position P along the predetermined direction D1.

Moreover, when the first operating member 31 is moved by the first force F1 to switch from the first state S1 (as shown in FIG. 5) to the second state S2 (as shown in FIG. 7), the first operating member 31 and the second operating member 32 are configured to interact with each other through the first gear structure 40 and the second gear structure 42 meshing with each other, such that the second operating member 32 is configured to be moved to switch from the first state S1 (as shown in FIG. 5) to the second state S2 (as shown in FIG. 7) in response to the movement of the first operating member 31. For example, the first operating member 31 is moved along a first rotating direction r1 to switch from the first state S1 (as shown in FIG. 5) to the second state S2 (as shown in FIG. 7), and the second operating member 32 is moved along a second rotating direction r2 to switch from the first state S1 (as shown in FIG. 5) to the second state S2 (as shown in FIG. 7).

In addition, when the locking member 30 is in the unlocking state K2 (as shown in FIG. 8), the auxiliary elastic member 54 is in a state of accumulating the auxiliary elastic force. On the other hand, when the first operating member 31 and the second operating member 32 are in the second state S2 (as shown in FIG. 7), the return elastic member 46 is in a state of accumulating the return elastic force.

Moreover, when the locking member 30 is in the unlocking state K2 (as shown in FIG. 8), the second rail 24 is able to be moved from the predetermined position P along the predetermined direction D1 to another predetermined position (such as an open position). Once the user stops applying the first force F1 to the first operating member 31 (the first operating part 50 of the first operating member 31), the first operating member 31 and the second operating member 32 is configured to return to the first state S1 (as shown in FIG. 5) from the second state S2 (as shown in FIG. 7) in response to the return elastic force released by the return elastic member 46, and the locking member 30 is configured to return to the locking state K1 (as shown in FIGS. 5 and 6) from the unlocking state K2 (as shown in FIGS. 7 and 8) in response to the auxiliary elastic force released by the auxiliary elastic member 54.

Figure 9:
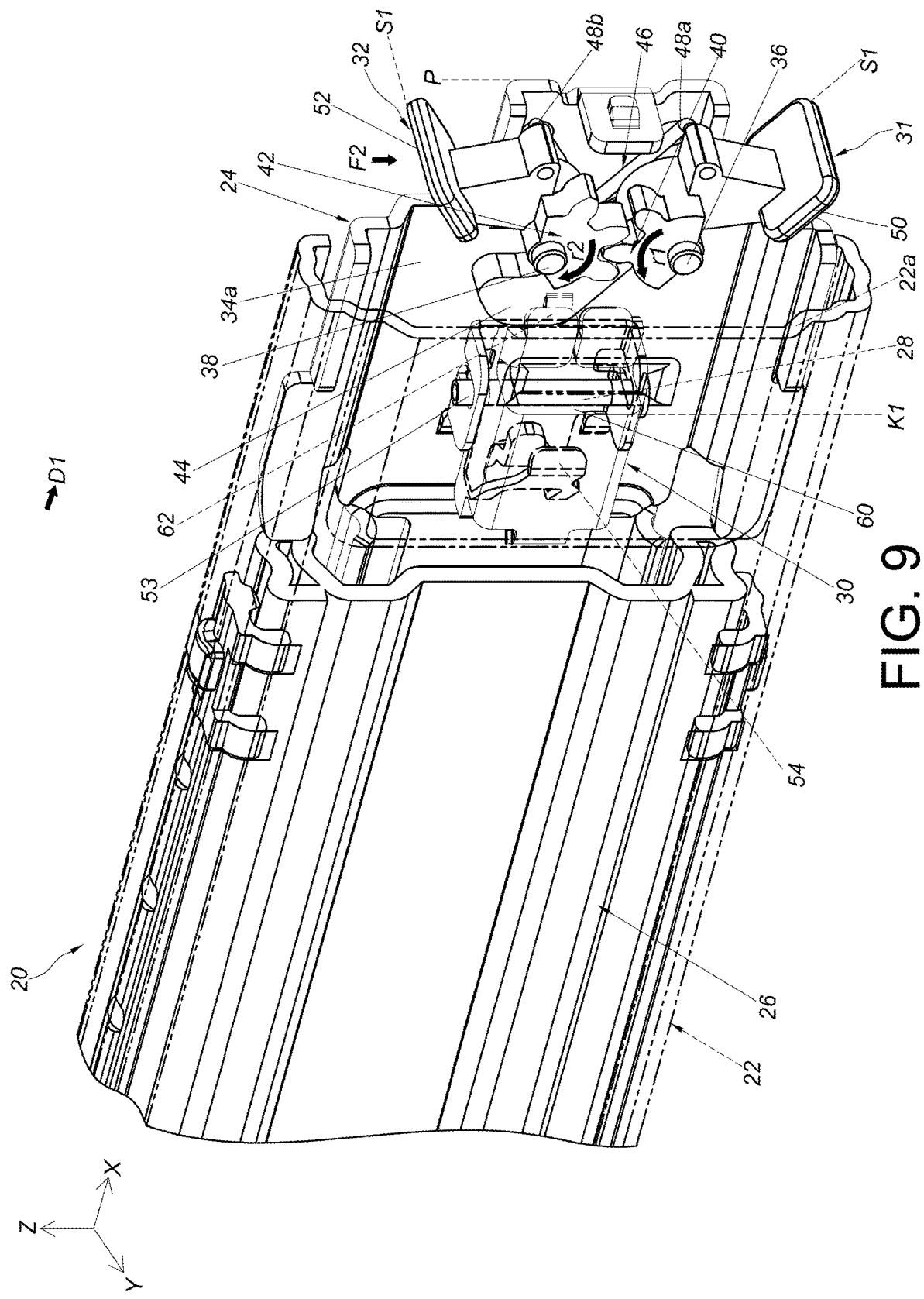
FIG. 9 is a diagram showing the second rail being locked at the predetermined position relative to the first rail, and the user operating the other one of the first operating member and the second operating member according to the embodiment of the present invention.

As shown in FIG. 7 to FIG. 9, when the second operating member 32 is operated, the locking member 30 is also configured to be moved to switch from the locking state K1 (as shown in FIG. 9) to the unlocking state K2 (as shown in FIG. 7 and FIG. 8) in order to allow the second rail 24 to be moved away from the predetermined position P. For example, the second rail 24 is able to be moved from the predetermined position P along the predetermined direction D1.

Furthermore, the user can apply a second force F2 opposite to the first force F1 to the second operating member 32 (the second operating part 52 of the second operating member 32) as shown in FIG. 9, in order to press the second operating member 32 to switch from the first state S1 (as shown in FIG. 9) to the second state S2 (as shown in FIG. 7). Further, the first operating member 31 and the second operating member 32 are configured to interact with each other through the first gear structure 40 and the second gear structure 42 meshing with each other, such that the first operating member 31 is configured to be moved to switch from the first state S1 (as shown in FIG. 9) to the second state S2 (as shown in FIG. 7) in response to the movement of the second operating member 32. During such process, the driving part 44 of the first operating member 31 is configured to contact the guiding feature 62 of the locking member 30 to easily drive the locking member 30 to switch from the locking state K1 (as shown in FIG. 9) to the unlocking state K2 (as shown in FIG. 7 and FIG. 8), in order to allow the second rail 24 to be moved from the predetermined position P along the predetermined direction D1. When the locking member 30 is in the unlocking state K2, the blocking feature 28 is no longer located on the moving path of the locking part 60 along the longitudinal direction (for example, the locking part 60 and the blocking feature 28 are not aligned with each other along the longitudinal direction), such that the locking part 60 and the blocking feature 28 no longer block each other (as shown in FIG. 8), in order to allow the second rail 24 to be moved from the predetermined position P along the predetermined direction D1.

Therefore, the user can operate the first operating member 31 or the second operating member 32 to unlock the second rail 24 relative to the first rail 22 at the predetermined position P, in order to allow the second rail 24 to be moved away from the predetermined position P.

Figure 10:
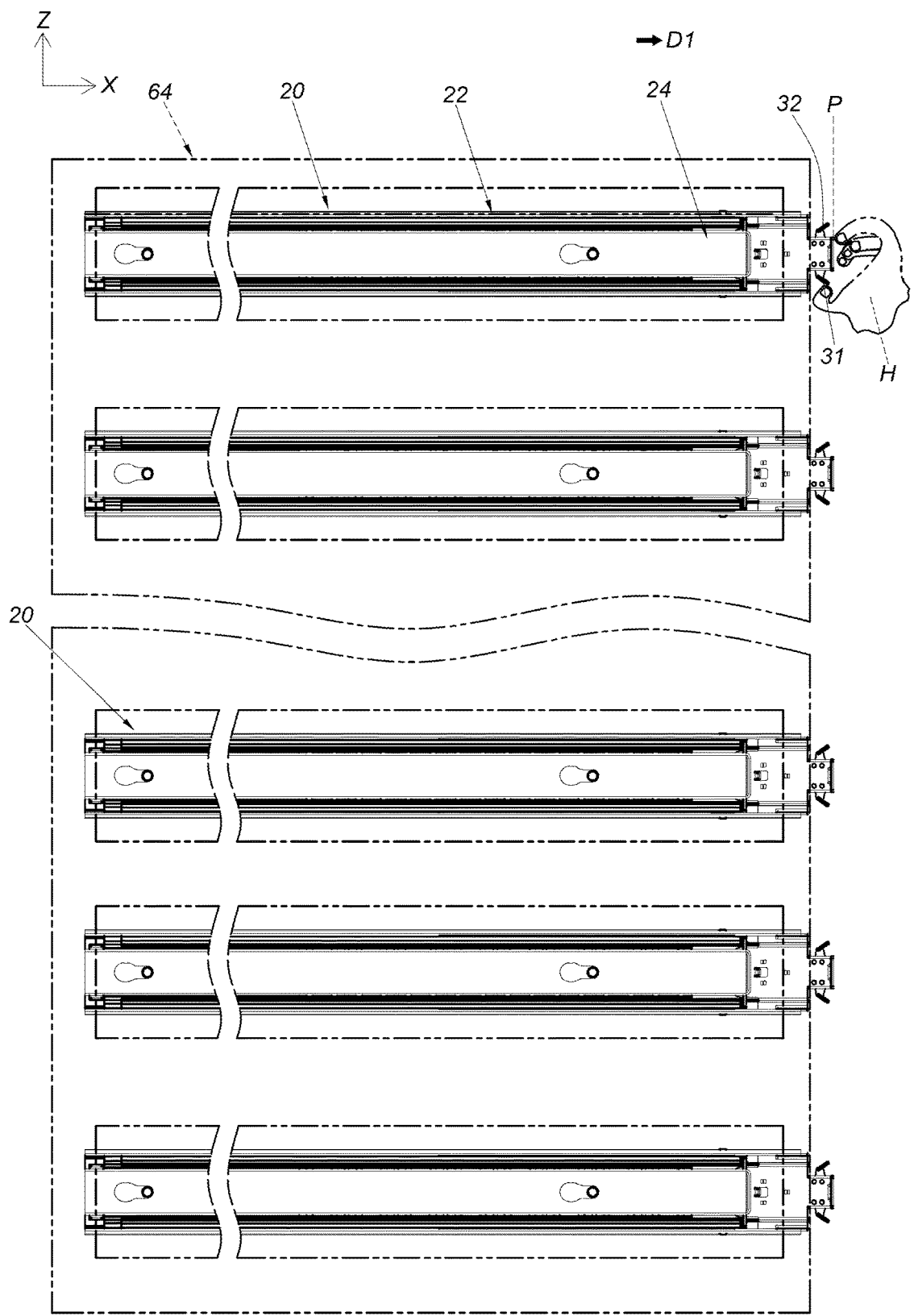
FIG. 10 is a diagram showing a plurality of slide rail assemblies being mounted to a rack, and the user operating the first operating member to unlock the second rail relative to the first rail of the slide rail assembly at the highest position according to the embodiment of the present invention.

As shown in FIG. 10, a plurality of slide rail assemblies 20 are mounted on a rack 64 (or a cabinet) along the height direction (such as the Z-axis direction), and the slide rail assemblies 20 have substantially the same structural configuration. Furthermore, when the user is going to operate the slide rail assembly 20 mounted at the highest position of the rack 64 with the second rail 24 being locked at the predetermined position P relative to the first rail 22, it is difficult for the user's hand H to reach and operate the second operating member 32 (the second operating part 52 of the second operating member 32) of the slide rail assembly 20 at the highest position. Therefore, the user can operate the first operating member 31 (the first operating part 50 of the first operating member 31) to drive the locking member 30 to switch from the locking state K1 (please also refer to FIG. 5) to the unlocking state K2 (please also refer to FIG. 7 and FIG. 8), in order to allow the second rail 24 of the slide rail assembly 20 at the highest position to be moved from the predetermined position P along the predetermined direction D1. Such configuration has been disclosed above, for simplification, no further illustration is provided.

Figure 11:
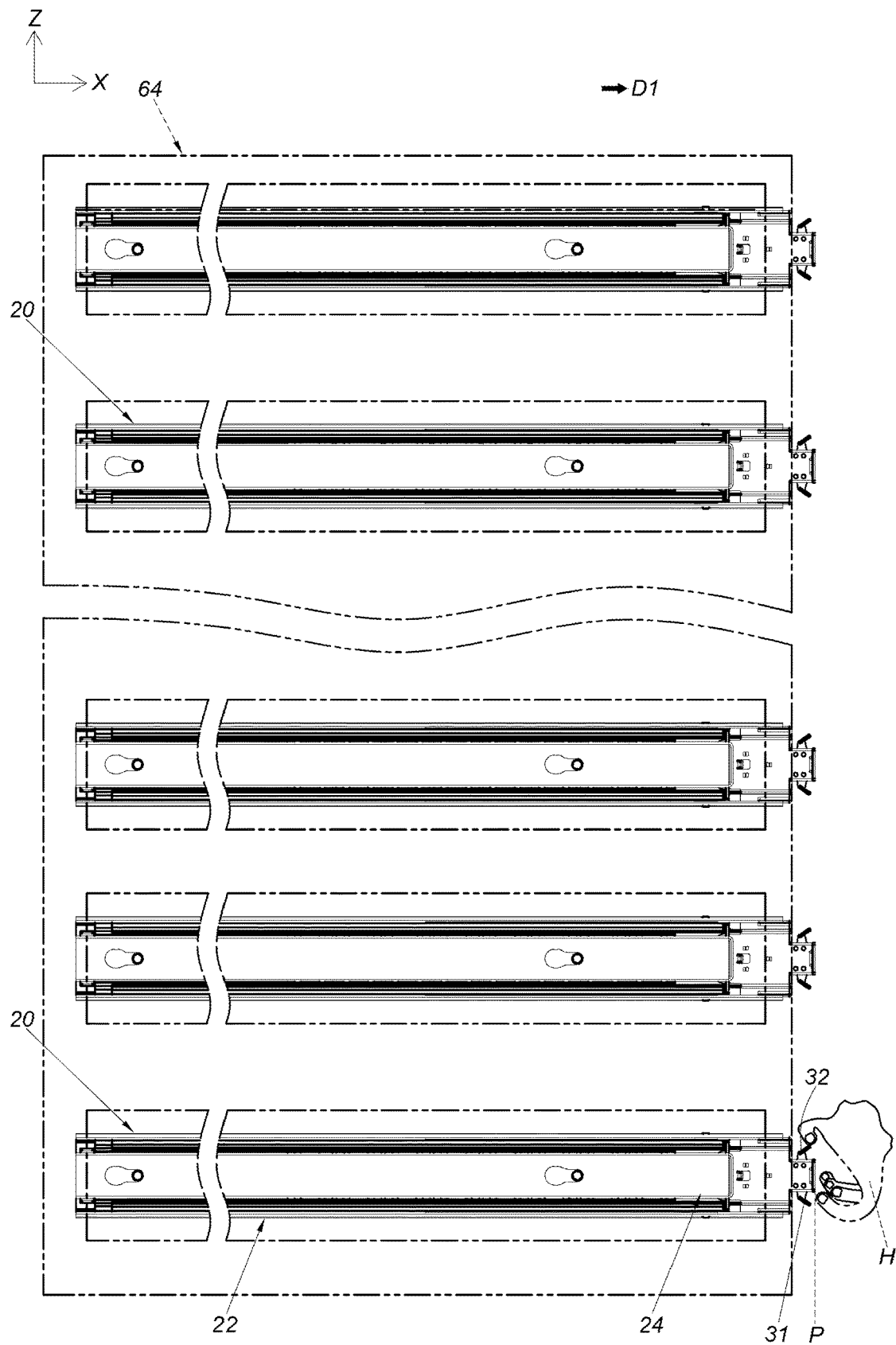
FIG. 11 is a diagram showing a plurality of slide rail assemblies being mounted to a rack, and the user operating the second operating member to unlock the second rail from the first rail of the slide rail assembly at the lowest position according to the embodiment of the present invention.

As shown in FIG. 11, when the user is going to operate the slide rail assembly 20 mounted at the lowest position of the rack 64 with the second rail 24 being locked at the predetermined position P relative to the first rail 22, it is difficult for the user's hand H to reach and operate the first operating member 31 (the first operating part 50 of the first operating member 31) of the slide rail assembly 20 at the lowest position. Therefore, the user can operate the second operating member 32 (the second operating part 52 of the second operating member 32) to drive the locking member 30 to switch from the locking state K1 (please also refer to FIG. 9) to the unlocking state K2 (please also refer to FIG. 7 and FIG. 8), in order to allow the second rail 24 of the slide rail assembly 20 at the lowest position to be moved from the predetermined position P along the predetermined direction D1. Such configuration has been disclosed above, for simplification, no further illustration is provided.

Therefore, the slide rail assembly 20 according to the embodiments of the present invention has the following technical features:

1. In the prior art, the user must press two actuating members of the latch assembly simultaneously to unlock the slide rail. In the present embodiment, when the second rail 24 is located at the predetermined position P relative to the first rail 22, the locking member 30 in the locking state K1 is configured to be blocked by the blocking feature 28. The user only needs to operate (such as press or push) one of the first operating member 31 and the second operating member 32 to drive the locking member 30 to switch from the locking state K1 to the unlocking state K2, such that the locking member 30 (the locking part 60 of the locking member 30) is no longer blocked by the blocking feature 28, in order to allow the second rail 24 to be moved away from the predetermined position P relative to the first rail 22.

2. When one of the first operating member 31 and the second operating member 32 is operated, the other one of the first operating member 31 and the second operating member 32 is configured to be driven to move through the first gear structure 40 and the second gear structure 42 meshing with each other.

3. One of the first operating member 31 and the second operating member 32 comprises the driving part 44, and the driving part 44 is configured to drive the locking member 30 to move to switch from the locking state K1 to the unlocking state K2.

4. The first operating part 50 of the first operating member 31 is located at the first height position (such as the lower position) on the second rail 24, and the second operating part 52 of the second operating member 32 is located at the second height position (such as the upper position) on the second rail 24.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail assembly, comprising:
a first rail;
a second rail, wherein the second rail and the first rail are longitudinally movable relative to each other;
a blocking feature arranged on the first rail;
two operating members movably mounted on the second rail, wherein the two operating members are pivotally connected to the second rail through a first shaft and a second shaft respectively, wherein the first shaft and the second shaft are arranged in a direction substantially identical to a transverse direction of the second rail; and
a locking member movably mounted on the second rail, wherein the locking member is pivotally connected to the second rail through a pivot member, wherein the pivot member is arranged in a direction substantially identical to a height direction of the second rail;
wherein when the second rail is located at a predetermined position relative to the first rail and when the locking member is in a locking state, the locking member and the blocking feature are configured to block each other in order to prevent the second rail from being moved away from the predetermined position;
wherein when one of the two operating members is operated to rotate around the first shaft or the second shaft, the locking member is configured to be driven to rotate around the pivot member to switch from the locking state to an unlocking state, such that the locking member and the blocking feature no longer block each other, in order to allow the second rail to be moved away from the predetermined position.

2. The slide rail assembly of claim 1, wherein the second rail has a first end part and a second end part opposite to each other, and the two operating members are movably mounted on the second rail and adjacent to the first end part.

3. The slide rail assembly of claim 1, wherein the two operating members have gear structures configured to mesh with each other.

4. The slide rail assembly of claim 1, wherein one of the two operating members comprises a driving part, and the driving part is configured to drive the locking member to move.

5. The slide rail assembly of claim 1, further comprising a return elastic member configured to provide an elastic force to one of the two operating members.

6. The slide rail assembly of claim 1, wherein the two operating members respectively comprise a first operating part and a second operating part configured to be operated by a user in a pressing manner.

7. The slide rail assembly of claim 1, wherein the slide rail assembly further comprises an auxiliary elastic member, and the locking member is configured to be held in the locking state in response to an elastic force of the auxiliary elastic member.

8. A slide rail assembly, comprising:
a first rail;
a second rail, wherein the second rail and the first rail are longitudinally movable relative to each other;
a first operating member and a second operating member movably mounted on the second rail, the first operating member and the second operating member respectively comprising a first gear structure and a second gear structure, wherein the first operating member and the second operating member are pivotally connected to the second rail through a first shaft and a second shaft respectively, wherein the first shaft and the second shaft are arranged in a direction substantially identical to a transverse direction of the second rail; and
a locking member movably mounted on the second rail, wherein the locking member is pivotally connected to the second rail through a pivot member, wherein the pivot member is arranged in a direction substantially identical to a height direction of the second rail;
wherein when the second rail is located at a retracted position relative to the first rail and when the locking member is in a locking state, the locking member and the first rail are configured to be locked with each other, in order to prevent the second rail from being moved away from the retracted position;
wherein during a process of one of the first operating member and the second operating member being operated to rotate around one of the first shaft and the second shaft to move from a first state to a second state, the other one of the first operating member and the second operating member is driven to rotate around the other one of the first shaft and the second shaft to move through the first gear structure and the second gear structure meshing with each other, and the locking member is configured to be driven to rotate around the pivot member to switch from the locking state to an unlocking state in order to allow the second rail to be moved from the retracted position along a predetermined direction.

9. The slide rail assembly of claim 8, wherein the first operating member and the second operating member respectively comprise a first operating part and a second operating part; wherein the first operating member further comprises a driving part, the driving part is configured to drive the locking member to move, and the first shaft is located between the first operating part and the driving part; wherein the first operating member further comprises a first working part located adjacent to the first shaft, and the first working part is arranged with the first gear structure, the second operating member further comprises a second working part located adjacent to the second shaft, and the second working part is arranged with the second gear structure.

10. The slide rail assembly of claim 8, further comprising a return elastic member configured to provide an elastic force to the first operating member and the second operating member; wherein the slide rail assembly further comprises an auxiliary elastic member, and the locking member is configured to be held in the locking state in response to the elastic force of the auxiliary elastic member.

11. The slide rail assembly of claim 8, wherein the second rail has a first end part and a second end part opposite to each other, and the first operating member and the second operating member are movably mounted on the second rail and adjacent to the first end part.

\* \* \* \* \*